United States Patent
Chaichanavong et al.

(10) Patent No.: US 9,294,130 B1
(45) Date of Patent: Mar. 22, 2016

(54) QUASI-CYCLIC LOW-DENSITY PARITY-CHECK (QC-LDPC) ENCODER

(71) Applicant: Marvell International Ltd., Hamilton (BM)

(72) Inventors: Panu Chaichanavong, Sunnyvale, CA (US); Gregory Burd, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 174 days.

(21) Appl. No.: 13/924,333

(22) Filed: Jun. 21, 2013

Related U.S. Application Data

(63) Continuation of application No. 12/553,584, filed on Sep. 30, 2009, now Pat. No. 8,473,824.

(60) Provisional application No. 61/095,131, filed on Sep. 8, 2008.

(51) Int. Cl.
*H03M 13/11* (2006.01)
*H03M 13/15* (2006.01)

(52) U.S. Cl.
CPC ...... *H03M 13/1182* (2013.01); *H03M 13/1102* (2013.01); *H03M 13/1148* (2013.01); *H03M 13/15* (2013.01)

(58) Field of Classification Search
CPC .................. H03M 13/1182; H03M 13/1148; H03M 13/1102
See application file for complete search history.

(56) References Cited

U.S. PATENT DOCUMENTS

| | | | | |
|---|---|---|---|---|
| 6,961,888 | B2 * | 11/2005 | Jin et al. | 714/752 |
| 7,120,856 | B2 * | 10/2006 | Zhang et al. | 714/801 |
| 7,243,286 | B2 * | 7/2007 | Kim et al. | 714/752 |
| 7,260,763 | B2 * | 8/2007 | Sukhobok et al. | 714/758 |
| 7,278,082 | B2 * | 10/2007 | Kim et al. | 714/752 |
| 7,313,752 | B2 * | 12/2007 | Kyung et al. | 714/801 |
| 7,346,832 | B2 * | 3/2008 | Richardson et al. | 714/779 |
| 7,389,464 | B2 * | 6/2008 | Jeong et al. | 714/752 |
| 7,395,494 | B2 * | 7/2008 | Lee et al. | 714/801 |
| 7,451,374 | B2 * | 11/2008 | Kim et al. | 714/748 |
| 7,480,845 | B2 * | 1/2009 | Kim et al. | 714/752 |
| 7,484,159 | B2 * | 1/2009 | Kan et al. | 714/755 |
| 7,493,547 | B2 * | 2/2009 | Kim et al. | 714/758 |
| 7,502,987 | B2 * | 3/2009 | Kyung et al. | 714/781 |
| 7,516,391 | B2 * | 4/2009 | Kyung et al. | 714/758 |
| 7,526,717 | B2 * | 4/2009 | Kyung et al. | 714/800 |
| 7,600,174 | B2 * | 10/2009 | Kyung et al. | 714/758 |
| 7,627,801 | B2 * | 12/2009 | Jin et al. | 714/757 |
| 7,657,816 | B2 * | 2/2010 | Cohen et al. | 714/752 |
| 7,747,929 | B2 * | 6/2010 | Kyung et al. | 714/779 |
| 7,814,393 | B2 * | 10/2010 | Kyung et al. | 714/758 |
| 7,882,414 | B2 * | 2/2011 | Choi et al. | 714/752 |

(Continued)

OTHER PUBLICATIONS

Chen Zhixiong et al., "A Construction of Linearly Encodable QC-LDPC Codes by Grouping Cyclic Shift and Block Elimination," Computing, Communication, Control, and Management, 2008 ISECS ISECS International Colloquium, 2:304-308 (2008).

*Primary Examiner* — Joseph D Torres

(57) ABSTRACT

Methods and systems are disclosed herein for generating parity information for using information in a low-density parity check (LDPC) encoder. A quasi-cyclic LDPC generator matrix K can be generated based on the non-invertible parity-check matrix H. Parity information can be generated by the LDPC encoder based at least in part on the user information, the non-invertible parity check matrix H, and the quasi-cyclic LDPC generator matrix K.

8 Claims, 4 Drawing Sheets

(56) References Cited

U.S. PATENT DOCUMENTS

| | | | |
|---|---|---|---|
| 7,962,828 B2 * | 6/2011 | Kyung et al. | 714/758 |
| 7,966,542 B2 * | 6/2011 | Richardson | 714/752 |
| 7,984,364 B2 * | 7/2011 | Park et al. | 714/781 |
| 8,020,062 B2 * | 9/2011 | Jeong et al. | 714/752 |
| 8,140,930 B1 * | 3/2012 | Maru | 714/752 |
| 2004/0255222 A1 * | 12/2004 | Kim et al. | 714/752 |
| 2005/0246611 A1 * | 11/2005 | Jin et al. | 714/754 |
| 2005/0283708 A1 * | 12/2005 | Kyung et al. | 714/758 |
| 2005/0283709 A1 * | 12/2005 | Kyung et al. | 714/758 |
| 2006/0036925 A1 * | 2/2006 | Kyung et al. | 714/758 |

* cited by examiner

QUASI-CYCLIC LOW-DENSITY PARITY-CHECK (QC-LDPC) ENCODER

CROSS-REFERENCE TO RELATED APPLICATIONS

This application is a continuation of U.S. application Ser. No. 12/553,584, filed on Sep. 3, 2009, which claims the benefit under 35 U.S.C. §119(e) of U.S. Provisional Application No. 61/095,131, filed Sep. 8, 2008, and each of which is hereby incorporated by reference herein in its respective entirety.

This is related to U.S. application Ser. No. 12/277,118, filed Nov. 24, 2008, now U.S. Pat. No. 8,219,868, which claims the benefit under 35 U.S.C. §119(e) of U.S. Provisional Application No. 60/991,450, filed Nov. 30, 2007, each of which is hereby incorporated by reference herein in its respective entirety.

BACKGROUND OF THE DISCLOSURE

The disclosed technology relates generally to data encoding, and more particularly to quasi-cyclic low-density parity check (LDPC) encoders.

With the continuing demand for high-reliability transmission of information in digital communication and storage systems, and with the rapid increase in available computational power, various coding and decoding techniques have been investigated and applied to increase the performance of these systems. One such coding technique, low-density parity check (LDPC) coding, was first proposed in the 1960s, but was not used until the late 1990s when researchers began to investigate iterative coding and decoding techniques.

LDPC codes are among the few known error control coding techniques capable of transmitting information at a rate close to the Shannon limit or channel-capacity. Currently, LDPC codes are considered to be the next-generation communication system encoding standard. LDPC codes can be regular or irregular, have a linear or cyclic coding matrix, and can be decoded in a myriad of ways, ranging in complexity and error performance.

SUMMARY OF THE DISCLOSURE

The present disclosure relates to methods and systems for generating parity information for using information in a low-density parity check (LDPC) encoder. A quasi-cyclic LDPC generator matrix K can be generated based on the non-invertible parity-check matrix H. This the quasi-cyclic LDPC generator matrix K is stored in a memory. Then the parity information can be generated by the LDPC encoder based at least in part on the user information, the non-invertible parity check matrix H, and the quasi-cyclic LDPC generator matrix K. In some embodiments, the stored quasi-cyclic LDPC generator matrix K may be valid for an user information that is to be encoded based on the non-invertible parity check matrix H.

In an embodiment, the quasi-cyclic LDPC generator matrix K can be calculated by selecting a quasi-cyclic square matrix M and then by calculating LDPC generator matrix K based on $\Phi K = M$, where the non-invertible parity check matrix H is $$\begin{bmatrix} A & B & T \\ C & D & E \end{bmatrix},$$

$F=(C+ET^{-1}A)$, and $\Phi=(D+ET^{-1}B)$. The quasi-cyclic square matrix M may be selected such that for any user information u, $(I+M)Fu=0$. The quasi-cyclic square matrix M may be selected such that is has a rank that is less than or equal to a rank of matrix $\Phi$ and such that $x^T M=0$ whenever $x^T \Phi=0$ for any vector x.

In an embodiment, a parity seed vector w can be computed based on the user information. The parity information is then generated based at least in part on the quasi-cyclic parity seed matrix K and the parity seed vector w. The parity seed vector w can be computed by solving $Mw=Fu$, where u is the user information.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Figure 1:
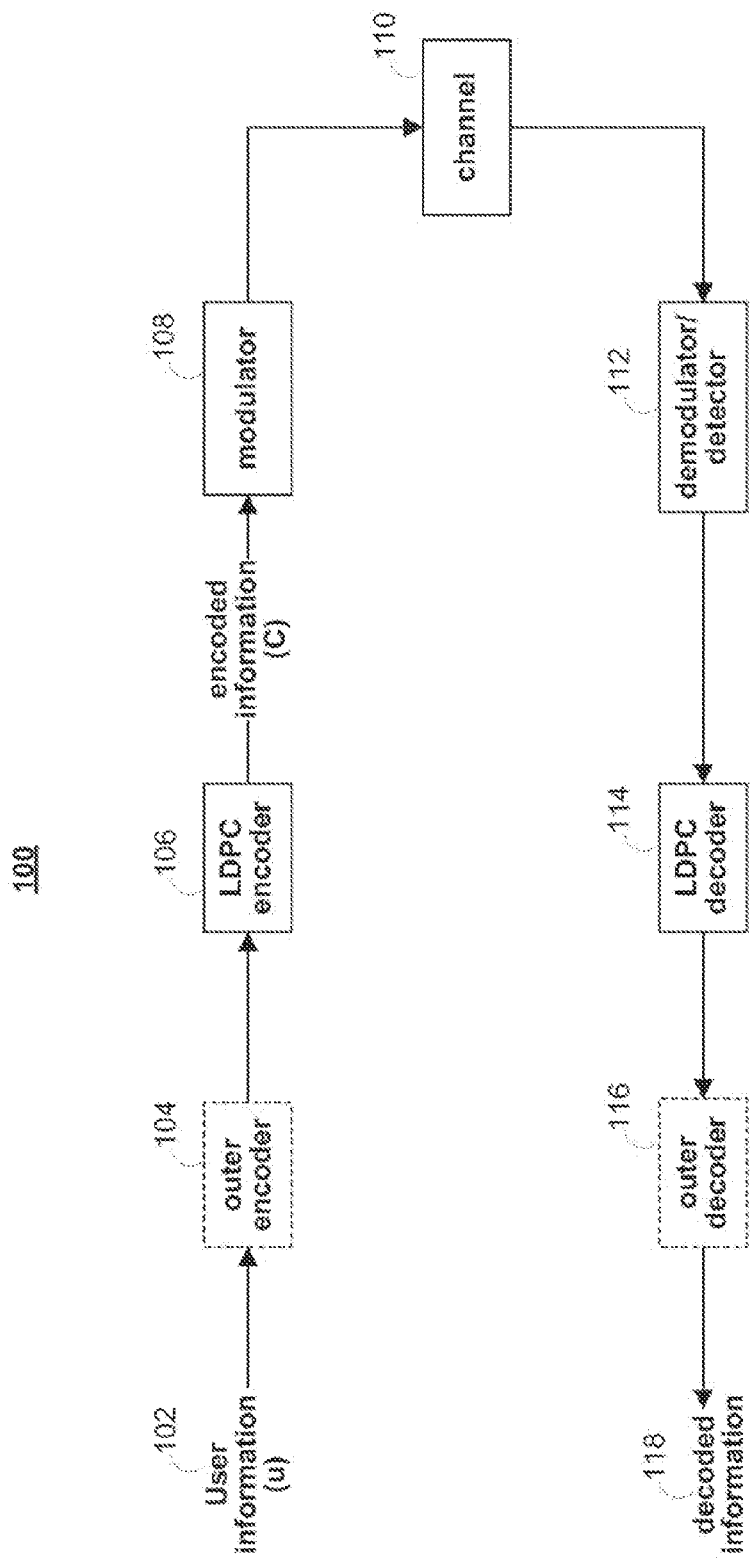
FIG. 1 is a simplified block diagram of an LDPC error-correcting communications or storage system.

FIG. 1 shows a simplified and illustrative block diagram of digital communications or storage system 100 that can employ the disclosed technology. System 100 may include LDPC encoder 106, modulator 108, demodulator 112, and LDPC decoder 114, and optionally outer encoder 104 and outer decoder 116. In some embodiments, system 100 may be any suitable communications system that is used to transmit user information 102 from a source to a destination. In other embodiments, system 100 may be a suitable storage system which is used to store and read back user information from a storage medium. User information 102, sometimes referred to by the variable u, may be any form of information or useful data that a user desires to transmit or store, and can be in any suitable digital form (e.g., coded data, uncoded data, etc.).

User information 102 may be transmitted or stored using one or more information-bearing signals. The signals may be transmitted or stored in any suitable transmission or storage medium or media, represented in FIG. 1 by channel 110. For example, channel 110 may be a wired or wireless medium through which the information-bearing signal travels, or an optical (e.g., a CD-ROM), magnetic (e.g., a hard disk), or electrical (e.g., FLASH memory or RAM) storage medium that stores the information-bearing signal. Due to random noise that may occur during transmission and storage, as well as the limited transmission or storage capabilities of channel 110, the information-bearing signal may be corrupted or degraded while being transmitted or stored. Thus, the signal received from channel 110 (e.g., by demodulator 112) may be substantially different than the signal that was originally transmitted or stored (e.g., from modulator 108). To reliably transmit or store information in channel 110, an effective transmitter for preparing and transmitting user information 102 may be needed, as well as a corresponding effective receiver for accurately interpreting user information 102 from a received signal.

In FIG. 1, the transmitter in communications or storage system 100 is embodied by outer encoder 104 (if present), LDPC encoder 106, and modulator 108. The receiver (described below) is embodied by demodulator 112, LDPC decoder 114, and outer decoder 116 (if present). Outer encoder 104 and LDPC encoder 106 may encode user information 102 into encoded information, sometimes referred to by the variable, c. In particular, outer encoder 104 may first encode user information 102 using a suitable code, which may be a systematic code. For example, outer encoder 104 may encode user information 102 using a Bose-Chaudhuri-Hocquenghem (BCH) or Reed-Solomon (RS) code of any suitable correction power. LDPC encoder 106 may then encode the resulting codeword into encoded information c. LDPC encoder 106 may operate concurrently or subsequent to outer encoder 104 using a suitable low-density parity check (LDPC) code that is selected from among a plurality of available LDPC codes.

Once LDPC encoder 106 produces the encoded information, modulator 108 may convert the encoded information into an information-bearing signal for transmission or storage in channel 110. Modulator 108 may operate using a modulation scheme with a signal constellation set of any suitable size and dimension. For example, modulator 108 may use a quadrature amplitude modulation (QAM) scheme (e.g., 4QAM, 16QAM, 32QAM, etc.), a pulse amplitude modulation (PAM) scheme (e.g., 2PAM, 4PAM, 8PAM, etc.), a phase shift keying (PSK) scheme (e.g., QPSK, 8PSK, etc.), and/or a orthogonal frequency division multiplexing (OFDM) scheme. The type of modulation scheme used by modulator 108 may be selected and implemented based on the properties of channel 110.

Demodulator 112 may receive an altered version of the information-bearing signal transmitted or stored by modulator 108. Demodulator 112 may then convert the information-bearing signal back into a digital sequence using the same modulation scheme as that of modulator 108. Demodulator 112 therefore produces a hard-bit or soft-bit estimate of the encoded information, c, that is decoded by LDPC decoder 114 and outer decoder 116. LDPC decoder 114 and outer decoder 116 may decode the estimated encoded information using the same LDPC and outer code, respectively, as those used by LDPC encoder 106 and outer encoder 108 to produce decoded information 108. Thus, if the hard-bit or soft-bit estimate is within the correcting capability of the LDPC and outer codes employed by decoders 114 and 116, decoded information 108 may be the same as user information 102.

As described above, communications or storage system 100 may or may not include outer encoder 104 and outer decoder 116. For purposes of clarity, and not by way of limitation, the various embodiments disclosed herein will often be described as if no outer code is used. For example, various embodiments may be described in which an LDPC encoder directly encodes user information (e.g., LDPC encoder 106 directly encoders user information 102). However, it should be understood that any of the disclosed embodiments of an LDPC encoder may instead encode the output of an outer encoder.

Figure 2:
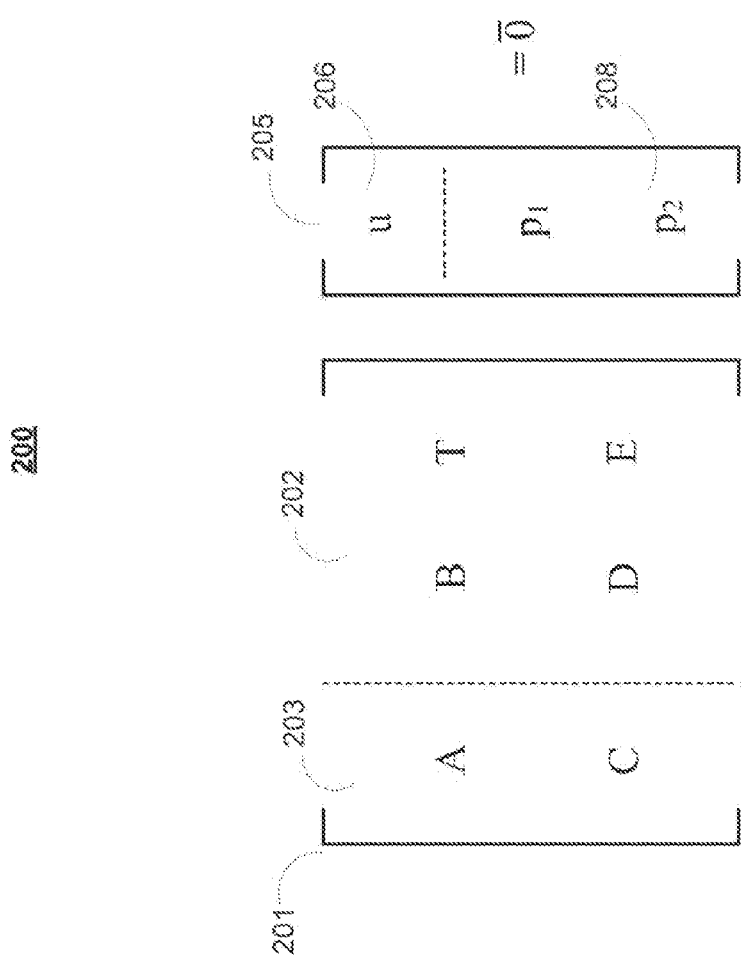
FIG. 2 is an LDPC coding equation based on a quasi-cyclic parity check matrix.

FIG. 2 shows illustrative coding equation 200 that is satisfied when LDPC encoder 106 (FIG. 1) generates encoded information, c, based on a QC-LDPC code defined by parity check matrix 201. In particular, LDPC encoder 106 creates the encoded information, c, in the form of codeword vector 205 that satisfies equation 200. Codeword vector 205 is composed of user information sub-vector 206 and parity sub-vector 208. Since user information sub-vector 206 represents user information 102 (FIG. 1) in vector form, LDPC encoder 106 (FIG. 1) generates codeword vector 205 by computing the parity components of parity sub-vector 208. The calculations implemented by LDPC encoder to compute parity components of parity sub-vector 208 are described in greater detail below.

Parity check matrix 201 is an illustrative parity check matrix defining a particular quasi-cyclic LDPC code that may be employed by LDPC encoder 106 (FIG. 1) and LDPC decoder 114 (FIG. 1) of system 100 (FIG. 1). As a quasi-cyclic parity check matrix, parity check matrix 201 is composed of circular submatrices (circulants) of the same size. A circulant submatrix is a square [m×m] binary matrix with the property that, each row is a cyclically shifted version of a previous row.

Figure 3:
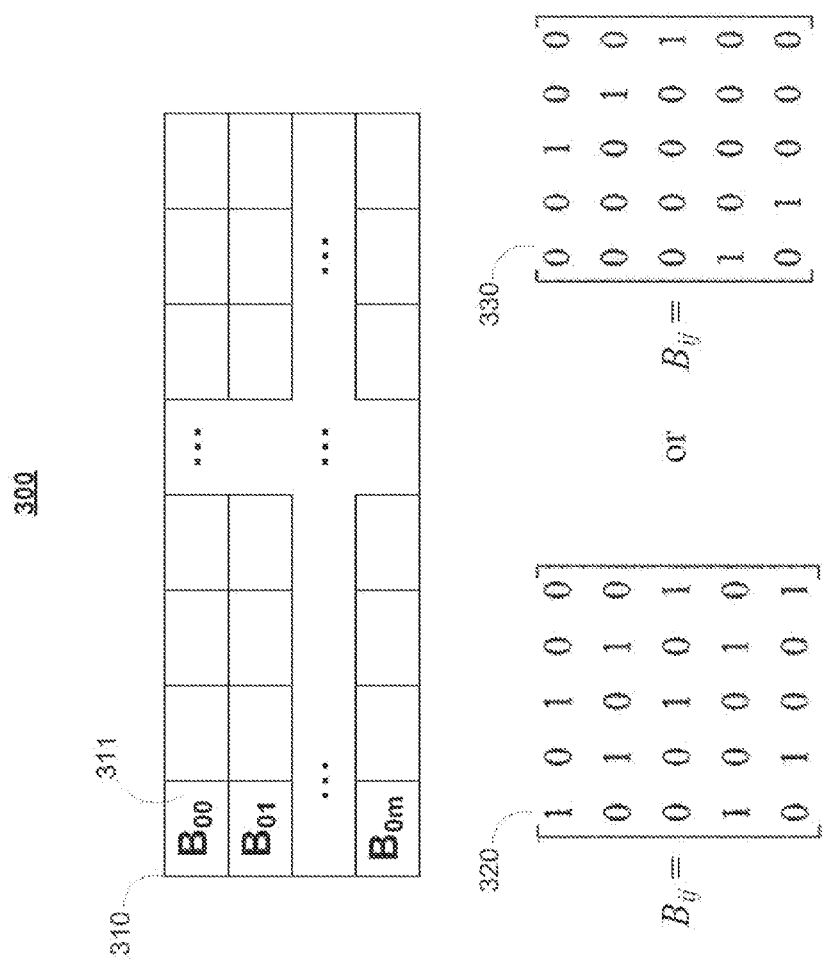
FIG. 3 is an illustrative quasi-cyclic matrix composed of a plurality of [5×5] circulants.

FIG. 3 shows an illustrative quasi-cyclic matrix 310 composed of a plurality of [5×5] circulants 311 which may be useful in explaining the structure of parity check matrix 201 (FIG. 2). Each circulant 311 may be a zero matrix (e.g., matrix of all zeros), a one matrix (e.g., matrix of all ones), an identity matrix, an identity matrix shifted by some amount, or any other arbitrary circulant. Circulants 320 and 330 are two exemplary circulant submatrices.

A quasi-cyclic matrix may be considered a sparse matrix if the circulants of the matrix have low row/column weight. The amount of storage required for a sparse quasi-cyclic matrix composed of a plurality of circulants may be reduced by representing each circulant in the matrix using a shorthand notation. For example, each circulant may be represented by storing the positions of the one-bits in its first row (or first column). This compressed representation may be used to store quasi-cyclic parity check matrix in a QC-LDPC coding system, such as that illustrated in FIG. 1. In contrast, a dense quasi-cyclic matrix is composed of a plurality of circulants having a high row/column weight. It may not be practical to store a dense quasi-cyclic matrix using the reduced representation used to store a sparse quasi-cyclic matrix. Alternatively, storing a dense quasi-cyclic matrix using the reduced representation may not significantly affect the amount of storage required to store the a dense quasi-cyclic matrix. A dense circulant may be compressed by storing only its first row or column. The other rows or columns in the dense circulant may be obtained by cyclically shifting the stored row or column.

Returning to FIG. 2, parity check matrix 201 may be represented by a data portions A and C (collectively referred to as the $H_u$ matrix) and a parity portions B, T, D, and E (collectively referred to as the $H_p$ matrix). The $H_u$ matrix includes the circulants in parity check matrix 201 that are multiplied by data symbols in data sub-vector 206 in equation 200, while the $H_p$ matrix includes the circulants in parity check matrix 201 that are multiplied by parity symbols in parity sub-vector 208. Because parity check matrix 201 is sparse, it may be stored in a reduced format. Parity portion T is a block triangular matrix (i.e., the circulant submatrices of T above the main diagonal are zero). Because parity portion T is a block triangular matrix, $T^{-1}$ exists and $T^{-1}x$ is easy to solve for any vector x, using back substitution.

Coding equation 200 shown in FIG. 2 may also be written as:

$$Hc=0 \quad\quad\quad (\text{EQ. 1})$$

where H is a parity check matrix and c is a codeword vector. Equivalently, parity check matrix H may be written as the combination of parity portions B, T, D, and E and data portions A and C and encoded information c may be written as parity information $p=[p_1; p_2]$ and user information u. Based on this, equation 1 may be rewritten as:

$$\begin{bmatrix} A & B & T \\ C & D & E \end{bmatrix} \cdot \begin{bmatrix} u \\ p_1 \\ p_2 \end{bmatrix} = \overline{0} \qquad \text{(EQ. 2)}$$

An LDPC encoder generates parity information $p_1$ and $p_2$ based on user information u such that, equations 1 and 2 are satisfied. Equation 2 may be further rewritten as:

$$Au + Bp_1 + Tp_2 = 0 \qquad \text{(EQ. 3a)}$$

$$Cu + Dp_1 + Ep_2 = 0 \qquad \text{(EQ. 3b)}.$$

Equation 3a may be rewritten as:

$$p_2 = T^{-1}(Au + Bp_1) \qquad \text{(EQ. 4)}$$

Substituting equation 4 into equation 3b:

$$Cu + Dp_1 + ET^{-1}(Au + Bp_1) = 0$$

$$(C + ET^{-1}A)u + (D + ET^{-1}B)p_1 = 0 \qquad \text{(EQ. 5a)}$$

Defining $(C+ET^{-1}A)$ as F and $(D+ET^{-1}B)$ as $\Phi$, equation 5a can be rewritten as:

$$Fu + \Phi p_1 = 0 \qquad \text{(EQ. 5b)}.$$

When parity check matrix H is full rank, matrix $\Phi$ is invertible. In this embodiment, parity information $p_1$ can be calculated from:

$$p_1 = \Phi^{-1} Fu \qquad \text{(EQ. 6)}.$$

Then parity information $p_2$ can be calculated from parity information $p_1$ using equation 4 above.

When parity check matrix H is not full rank and matrix $\Phi$ is not invertible, equation 6 cannot be used to calculate parity information $p_1$. In this case, a quasi-cyclic square LDPC generator matrix K is determined which in turn can be used to calculate parity information $p_1$ and $p_2$ from user information u and parity check matrix H. First, a quasi-cyclic square matrix M is selected such that $$(I+M)Fu = 0 \qquad \text{(EQ. 7)}$$

for any user information u. Then a quasi-cyclic square LDPC generator matrix K is calculated that satisfies the equation:

$$\Phi K = M \qquad \text{(EQ. 8)}.$$

Parity information $p_1$ can then be calculated as $$P_1 = KFu \qquad \text{(EQ. 9)}.$$

It can be verified from equations 7 and 9 that this parity $p_1$ satisfies equation 5b. In some embodiments, quasi-cyclic square matrices M and K are determined in advance and K can be stored in an LDPC encoder memory. Then the LDPC encoder can calculate parity information $p_1$ and $p_2$ using equations 9 and 4, respectively, for any user information u based on the stored value of LDPC generator matrix K.

For some parity check matrices H, there may not be quasi-cyclic square matrices M and K that satisfy the conditions of equations 7 and 8 for all values of user information u. For example, in addition to satisfying the condition of equation 7, $(I+M)Fu=0$, a value for quasi-cyclic square matrix M, may be selected such that: (1) $\text{rank}(M) \leq \text{rank}(\Phi)$ and (2) for any vector x such that $x^T\Phi=0$, $x^T M$ must also equal 0. These two additional conditions may be imposed on quasi-cyclic square matrix M to help ensure the existence of a valid LDPC generator matrix K. It should be noted that all of these conditions may not be sufficient to guarantee the existence of a valid LDPC generator matrix K. Namely, not all quasi-cyclic square matrices M that meet the conditions above have a corresponding valid value for LDPC generator matrix K.

From this point on, only LDPC codes satisfying the condition that the range space of F is equal to the null space of $1^T = [1\ 1\ 1\ 1\ \ldots\ 1]$ will be considered. Most LDPC codes with even column weights will satisfy this condition. The benefit of using LDPC codes that satisfy this condition is that in these codewords $1^T F = 0$ and $1^T \Phi = 0$. As seem below, this property can simplify the calculation of quasi-cyclic square matrix K.

If the circulant size of parity check matrix H is odd then M can be selected to be:

$$M = \begin{bmatrix} I & 0 & 0 & \ldots & 0 & 0 \\ 0 & I & 0 & \ldots & 0 & 0 \\ 0 & 0 & I & \ldots & 0 & 0 \\ \vdots & & & \ddots & & \vdots \\ 0 & 0 & 0 & \ldots & I & 0 \\ W & W & W & \ldots & W & I+W \end{bmatrix}$$

where W is the all-ones circulant. It can be seen that with this value of M, $(I+M)F=0$. Moreover, the rank of M is one less than its dimension. Therefore, the conditions of equations 7 and 8 and well as the other two conditions for matrix M are satisfied for this value of M. Accordingly, there exists LDPC generator matrix K such that $\Phi K=M$, which in turn can be used to calculate parity information $p_1$ and $p_2$ as described above.

Figure 4:
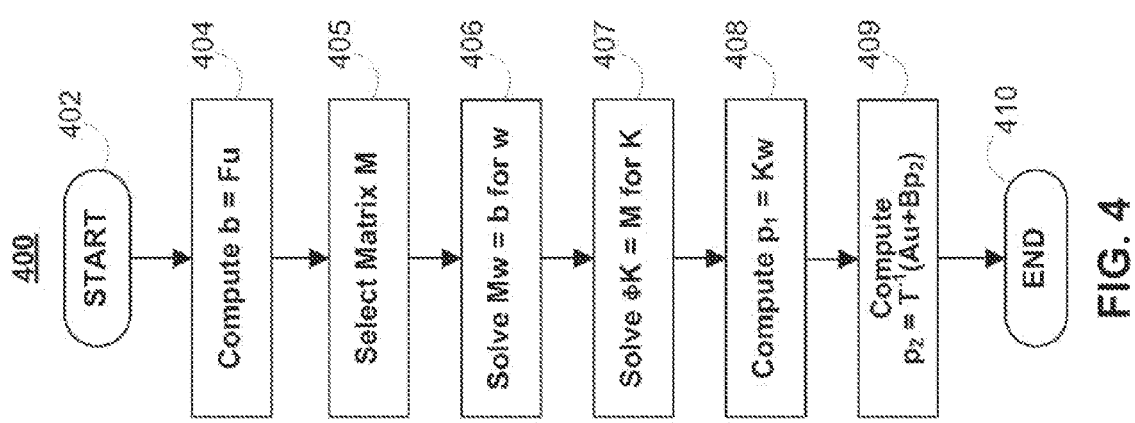
FIG. 4 is a flowchart of an illustrative process for generating parity information in an LDPC encoder.

If the circulant size of parity check matrix H is even, then M is full rank. Because $\Phi$ is not full rank, there may not be an LDPC generator matrix K such that $\Phi K=M$. In this instance, the condition $(I+M)Fu=0$ can be ignored and a parity seed vector w can be calculated using process 400 illustrated by the flowchart of FIG. 4. In particular, this illustrative process can be used to generate a parity seed vector w within an LDPC encoder (e.g., LDPC encoder 106 (FIG. 1)) based on user information u, which in turn can be used with LDPC generator matrix K to calculate parity information p within the LDPC encoder.

Process 400 begins at 402. At 404, vector b may be computed as:

$$b = Fu \qquad \text{(EQ. 10)}.$$

At 405, a quasi-cyclic square matrix M may be selected such that the equation:

$$Mw = b \qquad \text{(EQ. 11)},$$

is easy to solve and that there exists quasi-cyclic LDPC generator matrix K such that that $\Phi K=M$. At 406 equation 11 is solved for parity seed vector w. For example, matrix M may be selected as:

$$M = \begin{bmatrix} S & 0 & 0 & \ldots & 0 & I \\ I & I & 0 & \ldots & 0 & 0 \\ 0 & I & I & \ldots & 0 & 0 \\ \vdots & & & \ddots & & \vdots \\ 0 & 0 & 0 & \ldots & I & 0 \\ 0 & 0 & 0 & \ldots & I & I \end{bmatrix}$$

where I is the identity matrix and S is the permutation matrix obtained by cyclically shifting the identity matrix to the right by one. That is, S has the form:

$$S = \begin{bmatrix} 0 & 1 & 0 & 0 \\ 0 & 0 & 1 & 0 \\ 0 & 0 & 0 & 1 \\ 1 & 0 & 0 & 0 \end{bmatrix}.$$

In order to solve equation 11, the first block row of w denoted $w_1$ may be solved first. All block rows of w can be summed as, $(I+S)w_1 = \Sigma b_1$, where $b_1$ are the block rows of b. Because this equation is redundant the first entry of $w_1$ can be arbitrarily set to be zero. Then the next entry of $w_1$ can be computed recursively. Finally the other block rows of w can be computed recursively. This approach for solving equation 11 is illustrated in greater detail in related U.S. application Ser. No. 12/277,118, which was incorporated by reference above.

At 407, quasi-cyclic square matrix K can be selected or computed such that $\Phi K = M$. K may be calculated block-column by block-column using any suitable technique. For example, for each block-column, a vector k may be found such that $\Phi k = m$, where m is the leading column of M for that block. Let r and c be the dependent rows and columns of $\Phi$. Rows r and columns c are then removed from $\Phi$ to form $\Phi'$. Rows r are removed from m to form m'. $k' = \Phi'^{-1} m'$ is computed. The entries of column c of k are set to zero. The rest of k is assigned the values of k'. Then k is assigned to the first column of K in the current block. The rest of the current block can be obtained by circulant shifting. The remaining block columns of quasi-cyclic square matrix K can be computed using this technique. Finally, at steps 408 and 409 parity information $p_1$ and $p_2$ is calculated from LDPC generator matrix K as:

$$p_1 = Kw \quad \text{(EQ. 12)}$$

$$p_2 = T^{-1}(Au + Bp_1) \quad \text{(EQ. 13)}.$$

In summary, the approach used to calculate parity information $p_1$ and $p_2$ depends on characteristics of the parity check matrix H. Where parity check matrix H is full-rank (and therefore $\Phi$ is invertible), equation 6 may be used to calculate parity information $p_1$. Where parity check matrix H is not full-rank either equation 9 or the approach described with respect to FIG. 4 may be used to calculate parity information $p_1$. Equation 9 may be used to calculate parity information $p_1$ with LDPC generator matrix K that is computed from matrix M. The selection of matrix M depends one or more of the rank, circulant size, and the column weight of parity check matrix H.

The above described embodiments of the present invention are presented for the purposes of illustration and not of limitation. Since many embodiments of the invention can be made without departing from the spirit and scope of the invention, the invention resides in the claims hereinafter appended. Furthermore, the present invention is not limited to a particular implementation. For example, one or more steps of methods described above may be performed in a different order or concurrently and still achieve desirable results. The invention may be implemented in hardware, such as on an application specific integrated circuit (ASIC) or on a field-programmable gate array (FPGA). The invention may also be implemented in software.

What is claimed is:

1. A method of calculating parity information for user information in a low-density parity check (LDPC) encoder based on a parity check matrix H, the method comprising:
determining whether the parity check matrix H is full-rank, wherein the parity check matrix H has circulants A, B, C, D, E, and T, where A and C are circulants representing data portions of the parity check matrix H, and B, T, D, and E are circulants representing parity portions of the parity check matrix H;
when the parity check matrix H is full-rank:
calculating, using control circuitry, an encoding matrix based on a matrix $\Phi$ and a matrix F, wherein the matrix $\Phi$ is based on the circulants B, D, E, and T, and wherein the matrix F is based on the circulants A, C, E, and T; and
when the parity check matrix H is non-full-rank:
calculating, using the control circuitry, the encoding matrix based on a quasi-cyclic LDPC generator matrix K and the matrix F, wherein the quasi-cyclic LDPC generator matrix K is calculated based on the matrix $\Phi$ and a quasi-cyclic square matrix M;
storing the encoding matrix in an encoder memory;
calculating the parity information by processing the stored encoding matrix with the user information; and
generating an information-bearing signal by modulating the user information and the parity information.

2. The method of claim 1 further comprising computing parity information $p_1$ by solving an equation $p_1 = \Phi^{-1} Fu$, when parity check matrix H is full-rank.

3. The method of claim 1 further comprising computing parity information $p_1$ by solving an equation $p_1 = KFu$, when parity check matrix H is non-full-rank.

4. The method of claim 1, wherein determining whether parity check matrix H is full-rank comprises:
determining whether a number of columns is less than a number of rows of the parity check matrix H;
when the number of columns is less than the number of rows of the parity check matrix H:
determining a number of independent columns of parity check matrix H; and
determining that parity check matrix H is full-rank when the number of independent columns equals the number of columns of the parity check matrix H; and
when the number of rows is less than the number of columns of the parity check matrix H:
determining a number of independent rows of parity check matrix H; and
determining that parity check matrix H is full-rank when the number of independent rows equals the number of rows of the parity check matrix H.

5. A system for calculating parity information for user information in a low-density parity check (LDPC) encoder based on a parity check matrix H, the system comprising a low-density parity check (LDPC) encoder operative to:
determine whether the parity check matrix H is full-rank, wherein the parity check matrix H has circulants A, B, C, D, E, and T, where A and C are circulants representing data portions of the parity check matrix H, and B, T, D, and E are circulants representing parity portions of the parity check matrix H;
when the parity check matrix H is full-rank:
calculate an encoding matrix based on a matrix $\Phi$ and a matrix F, wherein the matrix $\Phi$ is based on the circulants B, D, E, and T, and wherein the matrix F is based on the circulants A, C, E, and T; and
when the parity check matrix H is non-full-rank:
calculate the encoding matrix based on a quasi-cyclic LDPC generator matrix K and the matrix F, wherein the quasi-cyclic LDPC generator matrix K is calculated based on the matrix $\Phi$ and a quasi-cyclic square matrix M;

store the encoding matrix in an encoder memory;

calculate the parity information by processing the stored encoding matrix with the user information; and generate an information-bearing signal by modulating the user information and the parity information.

6. The system of claim 5 wherein the LDPC encoder is further operative to compute parity information $p_1$ by solving an equation $p_1 = \Phi^{-1} Fu$, when parity check matrix H is full-rank.

7. The system of claim 5 wherein the LDPC encoder is further operative to compute parity information $p_1$ by solving an equation $p_1 = KFu$, when parity check matrix H is non-full-rank.

8. The system of claim 5, wherein to determine whether parity check matrix H is full-rank, the system comprising the LDPC encoder is further operative to:

determine whether a number of columns is less than a number of rows of the parity check matrix H;

when the number of columns is less than the number of rows of the parity check matrix H:

determine a number of independent columns of parity check matrix H; and determine that parity check matrix H is full-rank when the number of independent columns equals the number of columns of the parity check matrix H; and when the number rows is less than the number of columns of the parity check matrix H:

determine a number of independent rows of parity check matrix H; and determine that parity check matrix H is full-rank when the number of independent rows equals the number of rows of the parity check matrix H.

* * * * *